(12) United States Patent
Lim

(10) Patent No.: US 7,956,459 B2
(45) Date of Patent: Jun. 7, 2011

(54) SEMICONDUCTOR DEVICE AND METHOD OF ASSEMBLY

(75) Inventor: Chee Chian Lim, Alor Gajah Melaka (MY)

(73) Assignee: Infineon Technologies AG, Neubiberg (DE)

( * ) Notice: Subject to any disclaimer, the term of this patent is extended or adjusted under 35 U.S.C. 154(b) by 693 days.

(21) Appl. No.: 11/816,551

(22) PCT Filed: Feb. 28, 2005

(86) PCT No.: PCT/IB2005/000496
§ 371 (c)(1),
(2), (4) Date: May 14, 2008

(87) PCT Pub. No.: WO2006/090199
PCT Pub. Date: Aug. 31, 2006

(65) Prior Publication Data
US 2009/0001609 A1    Jan. 1, 2009

(51) Int. Cl.
*H01L 23/34* (2006.01)
*H01L 21/00* (2006.01)

(52) U.S. Cl. . 257/724; 257/784; 257/787; 257/E21.499; 257/E25.016; 438/107; 438/118

(58) Field of Classification Search ............... 257/724, 257/782, 784, 787, E21.499, E25.005, E25.016; 438/107, 118
See application file for complete search history.

(56) References Cited

U.S. PATENT DOCUMENTS

| | | | |
|---|---|---|---|
| 6,288,904 B1 * | 9/2001 | Houdeau et al. | 361/760 |
| 6,528,893 B2 * | 3/2003 | Jung et al. | 257/787 |
| 6,769,174 B2 * | 8/2004 | Siegel et al. | 29/832 |
| 2002/0167078 A1 * | 11/2002 | Winderl et al. | 257/684 |
| 2002/0197770 A1 | 12/2002 | Irie | |
| 2003/0015774 A1 * | 1/2003 | Auburger et al. | 257/666 |
| 2003/0057529 A1 | 3/2003 | Ikenaga | |
| 2003/0062613 A1 | 4/2003 | Masumoto et al. | |
| 2004/0017668 A1 * | 1/2004 | Siegel et al. | 361/760 |
| 2004/0089922 A1 | 5/2004 | Gerber et al. | |
| 2010/0148349 A1 * | 6/2010 | Kim et al. | 257/690 |

FOREIGN PATENT DOCUMENTS
WO     01/57924     8/2001

* cited by examiner

*Primary Examiner* — Tuan N. Quach
(74) *Attorney, Agent, or Firm* — Dicke, Billig & Czaja, PLLC

(57) ABSTRACT

An encapsulated leadless semiconductor package comprises a first semiconductor die and a second semiconductor die which are electrically connected by a bond wire. The lower surface of the first semiconductor die and the lower surface of the second semiconductor die are essentially coplanar with the lower surface of the encapsulation material.

17 Claims, 3 Drawing Sheets

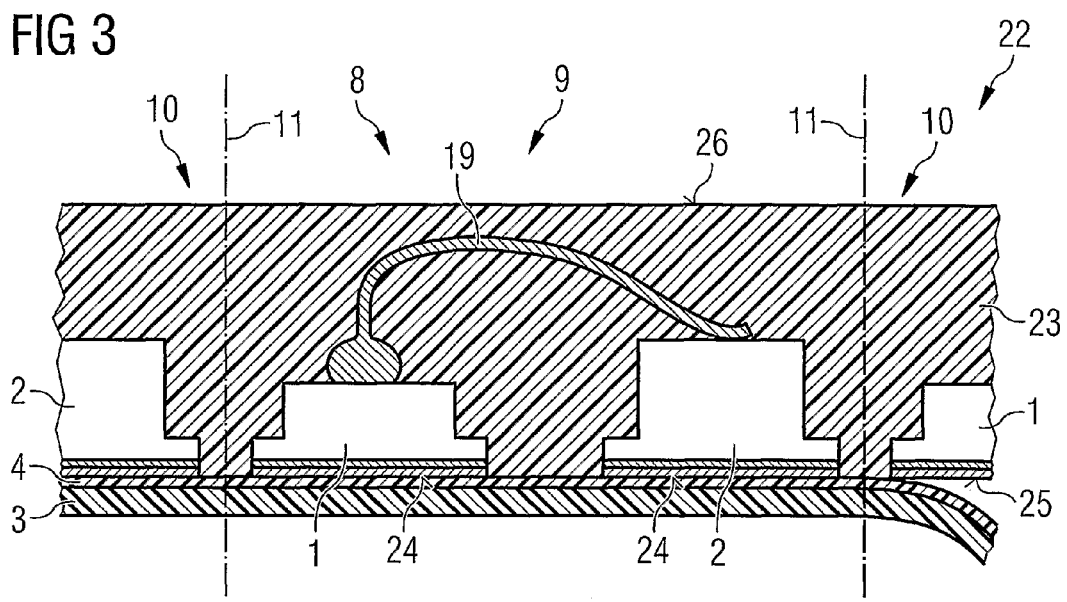
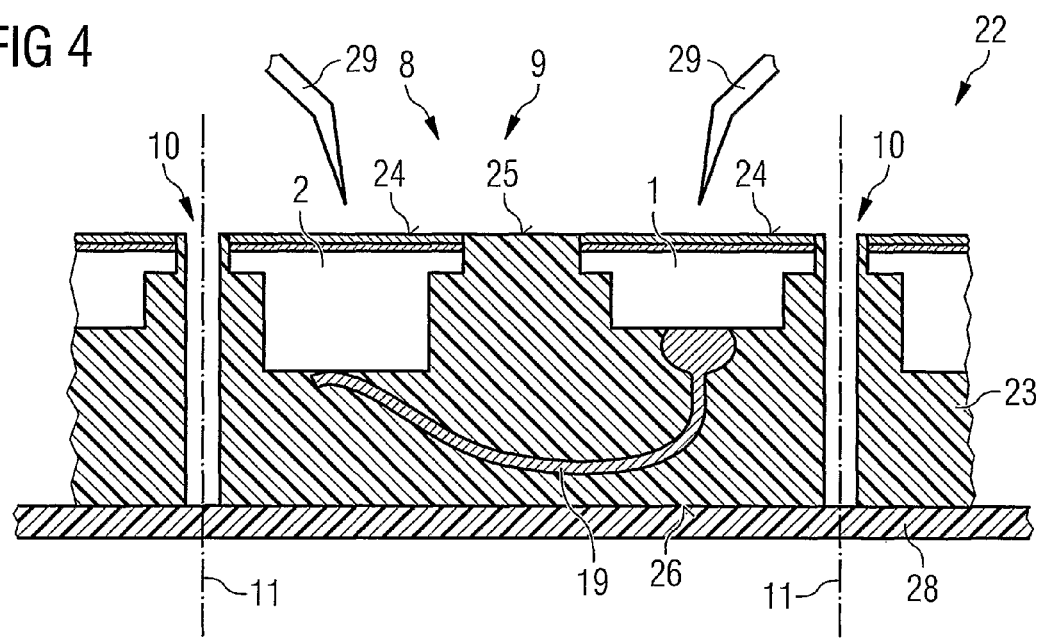

SEMICONDUCTOR DEVICE AND METHOD OF ASSEMBLY

CROSS REFERENCE TO RELATED APPLICATION

This Utility Patent Application claims the benefit of the filing date of International Application No. PCT/IB2005/000496, filed Feb. 28, 2005, herein incorporated by reference.

BACKGROUND

The invention relates to semiconductor packages, to intermediate products, such as a panel, and to methods of producing the panel and the semiconductor packages.

The reduction of the size and reduction of the cost of semiconductor packages is a long-standing desire in the development of semiconductor packages. It is desired to decrease both the footprint of the package, i.e. the lateral dimensions of the package, so that the space required to mount the package on the board is reduced, and the thickness of the package.

The cost of the semiconductor package can be reduced by reducing the materials costs by, for example, reducing the size of the package or through the choice of the materials. However, a greater cost saving can usually be achieved by simplifying and streamlining the production and assembly processes.

One approach to solving these problems is to provide a leadless semiconductor package, as is known, for example, from US 2004/0017668. In this method, a package substrate is prepared by forming a structured metal foil layer on a temporary carrier using photolithographic techniques. After the semiconductor chip is mounted to and electrically connected to the structured metal layer, the semiconductor chip, bond wires and the structured metal layer are embedded in molding compound to form a molded package. The temporary carrier is then removed to form a leadless semiconductor package in which the lower surfaces of the structured metal layer are exposed from the mold compound and provide the external contact areas of the package.

The prior art packages have the disadvantage that they are complicated and, therefore, costly to produce as a structured metal layer is produced to provide a substrate for the package.

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a cross-sectional view of a section of the panel of FIG. 2 after the molding process.

FIG. 4 illustrates a cross-sectional view of a section of the panel FIG. 3 after the re-taping and package singulation process.

DETAILED DESCRIPTION

Figure 1:
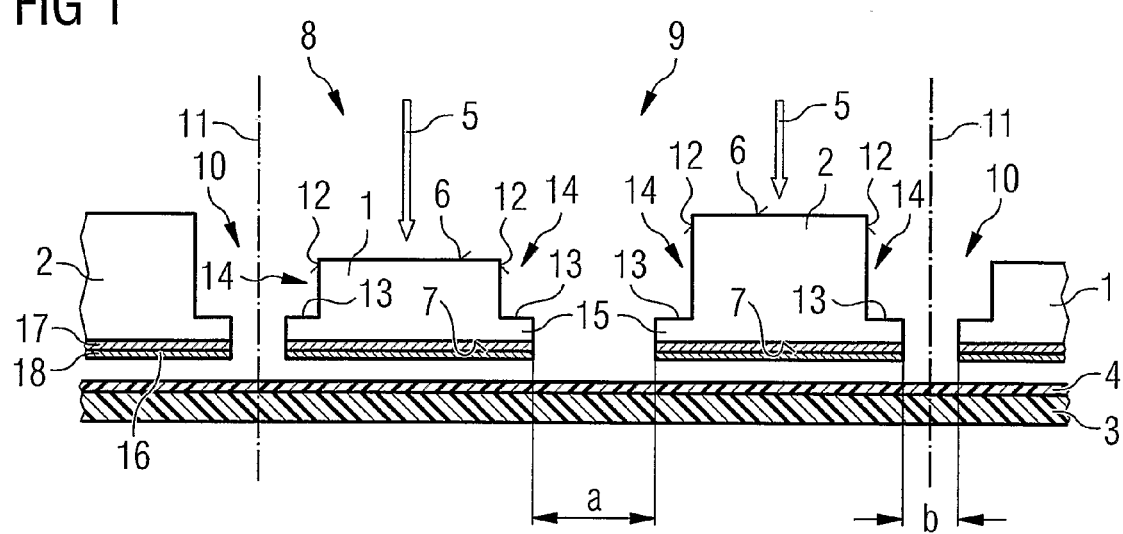
FIG. 1 illustrates the placement of semiconductor dies on an adhesive tape in a first stage of the assembly method of embodiments of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A semiconductor package according to embodiments of the invention includes a first semiconductor die or a semiconductor chip which has an upper surface and, on its opposing side, a lower surface. The semiconductor package also includes a second die or a second semiconductor chip, with an upper surface and, on its opposing side, a lower surface. The first semiconductor die is electrically connected to the second semiconductor die by a bond wire. The upper surface of the dies is defined as the surface on which the bond wire is located. This surface faces upwardly when the package is mounted on an external substrate. The lower surface of the dies includes no bond wire and faces downwardly when the package is mounted on an external substrate. The first die and second die form a component which is included in the package.

The package further includes mold or encapsulation material which encapsulates the upper and side surfaces of the semiconductor dies and the bond wire. The lower surfaces of the first and second die are essentially coplanar with the bottom surface of the mold material and form the outer bottom or lower surface of the package. The lower surfaces of the dies remain free from the encapsulation material and provide the external contacts to the package. This provides a leadless package. The package is, therefore, mounted to a higher-level substrate such as a printed external circuit board by the external contact areas.

In some embodiments, the first die is a receiver die and the second die is an emitter or a conductive die.

The lower surface of the first die and the lower surface of the second die includes a metallization layer. The metallization layer located on the lower or rear surface of the dies and the lower surface of the mold compound are essentially coplanar. The metallization layer enables the dies to be mounted to an external substrate such as a printed circuit board using a solder process. This provides a simple method of achieving a good bond using known and reliable techniques. As the metallization layer, which is disposed directly on the lower surfaces of the semiconductor chips or dies, provides the external contact areas of the package, the package avoids the use of an additional substrate such as a structured metal layer. Since the package avoids the use of a substrate which is included within the package, the thickness of the package is reduced and additional manufacturing processes which are required to fabricate the substrate are avoided and the cost of the package is reduced.

The package of the invention is very flexible as the two dies may have different dimensions. For example, the breadth and thickness of the first die is different to the breadth and thickness of the second die. The first die may, therefore, be fabricated on a first wafer and the second die on a second wafer. The first and second die can, therefore, include a different semiconductor material. The package of the invention is very flexible as the two types of die can be fabricated separately in two separately optimised processes and then assembled to form the semiconductor package.

In certain embodiments, the metallization layer includes two layers. For example, a first layer of nickel or a nickel alloy is disposed on the lower surface of the semiconductor dies and a second layer of silver or a silver alloy, or alternatively, gold or a gold alloy, is disposed on the first layer.

This structure has the advantage that a nickel layer can be more easily deposited on the semiconductor chip and a silver or a gold layer can be more easily deposited on the nickel layer. Therefore, a more reliable metallization layer which is less prone to delamination is provided. Also, the use of a silver or gold outer layer has the advantage that a good bond can be formed using known soldering techniques between the gold of the package contact area and the printed circuit board. Gold and silver and their alloys are noble metals and are not greatly affected by corrosion in the atmosphere. Thus a reliable and low resistance contact can be formed.

The first die and the second die have at least one side face with a stepped contour. This provides a form-locking engagement between the dies and the mold material. In exemplary embodiments, at least two opposing sides have a stepped contour as this singulation process is simplified if all the dies are singulated in one lateral direction by the same saw blade, if a profile saw is used to produce the step, or in the same method process, if two saw blades of different width are used to produce the step. A form-locking engagement reduces the likelihood of delamination of the mold material from the die and, therefore, provides a more reliable semiconductor package.

The first die and the second die have a protruding upper portion. This increases the lateral area of the active region of the upper surface of the dies. Alternatively, the first die and the second die have a protruding base portion. This provides a larger external contact area for the package. This leads to a lower contact resistance when the package is mounted on an external substrate.

The exemplary package has dimensions of approximately 0.5 mm in width, approximately 0.3 mm in breadth and approximately 0.2 mm in height. In other exemplary embodiments, the package has a height of around 0.1 mm. The package is, therefore, smaller than typical packages of the prior art.

Aspects of the invention also relate to an intermediate product or panel used in the fabrication of the semiconductor packages according to tone of the embodiments previously described. The panel includes a plurality of first and a plurality of second semiconductor dies which form components. One component is included in each semiconductor package. Each component has a first die with an upper surface and a lower surface and a second die with an upper surface and a lower surface. The first die and the second die of each component are separated by a pre-determined distance and are electrically connected to each other by a bond wire.

The panel further includes mold material in which the plurality of components are embedded. The upper surface and side faces of each die and the bond wire of each component are embedded in a single mass of mold material. The lower surface of the first die and the lower surface of the second die are essentially coplanar with the bottom surface of the mold material. The lower surfaces of the dies and the lower surface of the mold material provide the bottom surface of the panel. Since the rear surface of the dies is coplanar with the bottom surface of the mold material and, therefore, the outer surface of the panel, a thinner package is provided.

The panel includes a first upper surface and an opposing second lower surface. The second surface of the panel includes the lower surfaces of the first and second semiconductor dies and the lower surface of the encapsulation material. The second surface of the panel is attached to and covered by a first adhesive tape. The first adhesive tape protects the lower surfaces of the semiconductor dies from becoming contaminated by the encapsulation material during the molding or encapsulation process and from environmental contamination.

The plurality of first dies and the plurality of second dies have at least one side face with a stepped contour. This provides a form-locking engagement between the dies and the mold material. This increases the interfacial stability of the dies within the mold mass and reduces the likelihood that cracks will from at the interface either due to thermal cycling or during the singulation of the packages from the panel. The number of defective packages produced from a panel is, therefore, reduced. This reduces the costs of the correctly functioning packages.

The first dies and the second dies have a protruding base portion. This enables the dies to be easily singulated by sawing from the upper surface. Alternatively, the first dies and the second dies have a protruding upper portion. The active area of the upper surface of the dies is, in this alternative, increased.

The lower surface of the first dies and the lower surface of the second dies includes a metallization layer. The metallization layer enables these areas, which provide the external contact areas of the package, to be soldered to an external substrate. A low resistance contact is, therefore, provided.

The metallization layer and the bottom surface of the mold compound are essentially coplanar. The metallization layer, therefore, remains free of the mold material and forms the external contact areas of the component. The components, each including a first die and a second die can be singulated from the panel and can be mounted to an external substrate without further preparation of the external contact areas.

The metallization layer includes two layers. The first layer is disposed on the lower or rear surface of the dies and includes nickel or a nickel alloy and a second layer including silver or a silver alloy or gold or a gold alloy is disposed on the nickel layer.

In an embodiment of the panel of the invention, the first dies are receiver dies and the second dies are emitter or conductive dies. Each of the plurality of receiver dies and each of the plurality of emitter or conductive dies may be essentially the same or may be different. The panel may include a variety of different components which include different dies.

The panel includes a plurality of components, each component including one first die and one second die. The components are arranged in a regular matrix of rows and columns in which each component is separated from its adjacent neighbours by a defined distance or singulation trench in which no die or bond wire is situated. The centre lines of the singulation trenches are, therefore, arranged in a grid or matrix in two orthogonal lateral directions. The components can, therefore, be simply singulated or separated from the panel by cutting along the singulation trenches. This simplifies the singulation of the packages from the panel.

However, according to aspects of the invention, the distance between the two dies of a component need not be constant for each of the components in a panel. Therefore, the width of the singulation trenches in the panel may vary. To simplify the singulation process the centre lines of the singulation trenches remain in alignment and form a single grid. Therefore, after the singulation process, since the width of the saw blade is essentially constant, each package has essentially the same size. However, the thickness of the encapsulation material covering of the side faces of the dies may vary between the packages and between the two dies within a package.

The invention also relates to methods of fabricating the semiconductor package and panel according to one of the embodiments already described.

A method to fabricate a panel includes the following processes. Firstly, a first semiconductor wafer including a plurality of first semiconductor dies is provided. A second semiconductor wafer including a plurality of second semiconductor dies is also provided. As previously described, the first and second semiconductor wafers include different types of device and may be of a different thickness.

The first semiconductor wafer is then singulated to produce a plurality of first dies. The second semiconductor wafer is also singulated to produce a plurality of second dies. The singulation is easily and simply performed using known sawing techniques. The plurality of first dies and the plurality of second dies each have and upper surface and a lower surface.

A first adhesive tape is also provided. The adhesive tape includes a single adhesive surface and has a breadth at least the breadth of a single semiconductor package. In the next step of the process, a first semiconductor die is attached to the adhesive surface of the first adhesive tape by its lower surface. A second semiconductor die is attached to the first adhesive tape and is positioned adjacent to be the first semiconductor die. A first semiconductor die and a second semiconductor die form a component. The first and second semiconductor dies within a component are separated by a defined distance.

In the next stage of the process at least one further component is attached to the adhesive surface of the first semiconductor tape. This is performed by attaching a further first semiconductor die at a defined second distance from either one of the dies already attached on the adhesive tape. This second distance is the singulation trench between adjacent components. A second semiconductor die is then attached to the adhesive tape at a defined distance from the first semiconductor die thus attaching a second component to the adhesive tape.

However, the plurality of first semiconductor dies and the plurality of second semiconductor dies may be mounted on the adhesive tape is almost any order which is convenient. The dies may be mounted using pick-and-place techniques. The components are arranged so that the centre lines of the singulation trenches form a single square or rectangular gird array as this simplifies the package singulation process. If a saw blade with a width of 20 µm is used for the singulation, the singulation trench width can be as small as 30 µm.

Since the dies are placed individually on the adhesive tape by a pick-and-place technique, the method of the invention has the advantage that a panel may include a variety of different dies and that the dies may have different die-to-die spacings. This method also has the advantage that it is relatively simple to change the unit spacing and the die-to-die spacing between different processes runs since a substrate is not provided within the package. The dies can be simply placed with the desired arrangement directly on the adhesive tape.

The use of an adhesive tape has the advantage that the tape is able to absorb the impact of the die placement so that distress on the die is reduced and cracking of the die is more unlikely. This also enables the thickness of the die to be reduced to up to 50 µm (microns) or even 25 µm. A further advantage is that the die is placed at room temperature so that the processes of curing die attach material or producing a eutectic bond between the die and a substrate are avoided. This avoids the possibly of damage to the die caused by the high die attach process temperatures and simplifies the assembly process and reduces costs.

A bond wire is formed between a first die and a second die to form a component. A bond wire is formed between each pair of dies which form a component within the panel. A plurality of components are, therefore, formed while the components are attached to the adhesive tape and have the form of a panel. Since the components have a high packing density, the bonding process can be easily and quickly carried out using automated equipment. This simplifies the manufacturing process and reduces the costs of producing the package.

The plurality of components are embedded or encapsulated in a single mass of a mold compound to form a panel. The mold or encapsulation compound may include an epoxy resin which is given an appropriate curing treatment to create a solid mass in which the upper surfaces and side faces of the dies and the wire bonds are embedded. As the lower surfaces of the dies are attached to the adhesive tape, the lower surfaces remain free of the mold material. Since the lower surfaces of the dies provide the external contact areas of the package, the external contact areas remain free of the mold material. The lower surface of the panel which is made up of the lower surfaces of the dies and lower surface of the encapsulation material is, therefore, attached to the upper surface of the adhesive tape.

The method of the invention also includes the further process of providing a metallization layer on the lower or rear surface of both the first plurality of semiconductor dies and the second plurality of semiconductor dies. Since these surfaces are in contact and covered by the adhesive tape during the subsequent assembly processes, the surfaces remain free of contamination by mold material and cutting fluids.

The metallization layer is provided by depositing a metallization layer on the rear surface of the dies while they are in the form of a wafer, i.e. before the singulation process. This reduces manufacturing costs and provides a high quality coating. If the first plurality of dies and second plurality of dies are fabricated on separate wafers, the metallization may include a different material or a different thickness on each of the dies of a component.

The metallization layer includes two layers which are deposited in two process steps. The first layer is deposited on the rear surface of the first and second dies by a vacuum-deposition technique such as evaporation, sputtering or laser ablation. This provides a good adhesion between the first metallization layer and the semiconductor chip and delamination of the first layer from the die is less likely. A second layer is then deposited on the first layer using a non-vacuum deposition technique such as an electro-plating or electro-deposition or a galvanic technique. This has the advantage that the complicated equipment and pump-down times associated with vacuum-deposition are avoided. Electro-deposition techniques have the advantage that wastage of material is reduced since only the material which is deposited on the wafer is removed from the source.

The first dies and the second dies are singulated from the wafer to form at least one side face with a stepped contour. This is easily carried out by using either a profile saw or in two cutting steps by using two saw blades of different widths. The step provides a form-locking engagement between the dies and the mold compound which leads to a more reliable package.

The first dies and the second dies are singulated to form two opposing side faces with a stepped contour. This simplifies the singulation process as all of the cuts in one lateral direction can be made in the same process step. The side faces of the die have essentially the same contour since this provides improved form-locking and a more uniform stress distribution. This further improves the reliability of the package.

After the panel has been formed and the lower surface of the panel is attached to the adhesive surface of the adhesive tape, the following further assembly processes are carried out. The individual packages may be laser marked on the upper surface of the package. The first adhesive tape is removed which reveals the bottom surface of the dies and, if included, the metallization layer. A second package lamination adhesive tape is attached to the opposing upper side of the panel.

The packages, each including a component having a first die and a second die which are electrically connected by a bond wire, are singulated from the panel by cutting along the centre line of the grid of singulation trenches. This is performed by making a cut in the lower surface of the panel along the singulation line. This creates individual packages which are attached by their upper surface to the second adhesive or package lamination tape.

The packages can then be tested while still in the form of the panel and while attached to the package lamination tape as the external contact areas are exposed from the package housing. This enables a rapid testing of the packages and the easy identification of defective packages. The package lamination tape is then removed and the correctly functioning packages packed into carrier or shipping tape for transportation to their point of use.

The second adhesive tape and/or the first adhesive tape is removed by irradiating the tape with UV-irradiation. This enables the tape to be removed from the panel without leaving residues. The surfaces of the external contact areas remain free from contamination and a reliable low resistance contact interface can be provided.

The method of the invention also has the advantage that as a substrate within the package is avoided, the thickness of the package is reduced. The electrical performance of the package is also improved and power consumption reduced since there is no power loss due to the relatively high resistance of a substrate. Since the electrical performance is improved, this enables the use of bonding wires of a smaller diameter, for example 18 μm (micron), which further reduces the materials costs of the package. Materials costs are also reduced by the method of the invention as a single-use carrier substrate which is then removed, often by an etching process, is avoided.

Since the bonding and encapsulation processes are carried out while the die and components are held in the form of a panel, the packing density of the components in the panel can be much higher than in conventional processes. The molding and testing process is, in particular, accelerated. Since the packages are attached to the adhesive tape as a panel, essentially wafer level testing of the packages is enabled.

The invention enables the manufacturing costs of the packages to be reduced since the use of a lead frame or structured metal layer is avoided. Therefore, the number of manufacturing processes are reduced, reducing the assembly costs. It is estimated that by using conductive die instead of an etched lead frame costs may be reduced by 27%. Also, since the die is attached directly to the adhesive tape at room temperature, possible oxidation of the lead frame due to high die attach temperatures is avoided as is the requirement to perform the die attach process under nitrogen or forming gas.

Also, the problems associated with warpage of the leadframe strip along the assembly process line are avoided so that assembly can take place in a full tape area. The additional costs and manufacturing complexity associated with the provision of raised bumps on the lead frame substrate onto which the dies or contacts are positioned are also avoided.

An additional advantage of the method according to the invention is that different package sizes may be assembled in the same tape length or in a subsequent tape length by only minor adjustment to the assembly line. A different leadframe or substrate is not required so that start-up costs and retooling costs are reduced.

Additionally, the spacing between the dies, or die to die distance, can be varied depending on the electrical performance requirement. The die-to-die distance can be varied within the same tape length or between subsequent tape lengths. The method according to the invention also lends itself to reel to reel processing.

Since stress is avoided at the die attach process by the use of vacuum die pick up and place techniques to absorb vibration and impact stress, a thinner die, perhaps as thin as 25 μm or lower, can be reliably attached to the tape. The spacing between components can be as low as 30 μm or even as low as 20 μm if a laser dicing technique is used. Therefore, a high unit density panel can be provided which can also have a flexible die to die distance within the panel.

Through the use of the method of the invention, semiconductor packages which are two times smaller than conventional TSLP packages can be provided. Packages can be provided with a footprint of 0.3 mm by 0.5 mm and with a thickness of only 0.2 mm and even 0.1 mm.

FIG. 1 illustrates portions of a method according to the invention to fabricate a leadless semiconductor package. Initially, a first precursor semiconductor wafer is fabricated which includes a plurality of receiver dies 1. A second precursor semiconductor wafer is fabricated which includes a plurality of emitter or conductive dies 2. The first and the second wafers are then singulated to provide a plurality of respective receiver dies 1 and conductive dies 2.

FIG. 1 illustrates the first stage in the method according to embodiments of the invention. Firstly, an adhesive tape 3 is provided which includes a single adhesive surface 4. A plurality of receiver dies 1 and a plurality of emitter or conductive dies 2 are placed onto the upper adhesive surface 4 of the adhesive tape 3 by a pick-and-place technique as is indicated by the arrows 5. Each die has an upper surface 6 and a lower surface 7.

In this embodiment of the invention a package 8 includes a component 9 which includes a receiver die 1 and an emitter die 2. The receiver die 1 and the emitter die 2 are separated by a distance denoted in FIG. 1 by a. A plurality of components 9 are placed on the adhesive tape 3. This may be carried out by placing a number of receiver dies 1 on the adhesive tape followed by a number of emitter dies 2 or by alternately placing a receiver die 1 and an emitter die 2 on the adhesive tape 3.

In the embodiment of FIG. 1 the components 9 are arranged so that the receiver die 1 of one component 9 is placed adjacent to the emitter die 2 of the adjacent component 9. The distance between the components 9 is denoted by b. The distance b denotes the saw street or singulation trench 10 between the adjacent components 9 and in this embodiment the singulation trench has a width b of 30 μm. The lateral centre of the singulation trenches 10 are indicated by the line 11.

Although this is not visible in the cross-sectional view of FIG. 1, the centre lines of the singulation trenches 11 are arranged in a rectangular grid array. Also, since the receiver dies 1 and emitter dies 2 are placed individually on the adhesive tape 3 the distance a between a receiver die 1 and an emitter die 2 of a component 9 may be varied. In this case, since the centre lines of the singulation trenches 11 have the form of a rectangular grid the width of the singulation trench b will also vary accordingly.

In this first embodiment of the invention, the receiver dies 1 and the emitter dies 2 are singulated from their respective wafers to form side faces 12 of the receiver dies 1 and emitter dies 2 which have a non-straight contour. In this embodiment, the side faces 12 to both the receiver die 1 and the emitter die 2 which include a step 13. This is carried out either using a two-part sawing process using two saw blades of different widths or by a single sawing cut by using a profile saw.

In this first embodiment of the invention, both the receiver dies 1 and emitter dies 2 include a cutout 14 in the edge formed between the upper surface 6 and the side faces 12 of the dies 1, 2. Each die 1, 2, therefore, has a base portion 15 which protrudes outwards providing a step 13 in the side faces 12. The base portion 15 and, therefore, the lower surface 7 of the die 1, 2 is laterally larger than the upper surface 6 of the die 1, 2. The step 13 formed in the side faces 12 improves the locking of the mold compound of the semiconductor package with the semiconductor dies as a form-locking engagement is provided.

The lower surface 7 of each receiver die 1 and emitter die 2 includes a metallization layer 16. The metallization layer 16 was deposited on the rear surface of the dies during the fabrication process of the initial precursor wafers. The metallization layer 16 enables the package 8 to be soldered onto an external substrate such as a printed circuit board.

The metallization layer 16 includes, in this embodiment of the invention, two metallic layers 17, 18. A layer of nickel 17 is disposed on the lower surface 6 of the receiver die 1 and emitter die 2 and a layer of gold 18 is disposed on the layer 17 of nickel. Alternatively, the metallization layer 16 may include a layer of nickel 17 and a layer of silver 18. The nickel layer 17 was deposited by a vacuum technique and the layer of gold was deposited by an electro-plating technique.

The cross-sectional view of the component 9 of FIG. 1 also illustrates that the thickness of the receiver die 1 and thickness of the emitter die 2 is not identical. In this embodiment of the invention, the receiver die 1 is thinner than the emitter die 2. This is easily accomplished as each type of die 1, 2 is initially fabricated on a separate precursor wafer.

Figure 2:
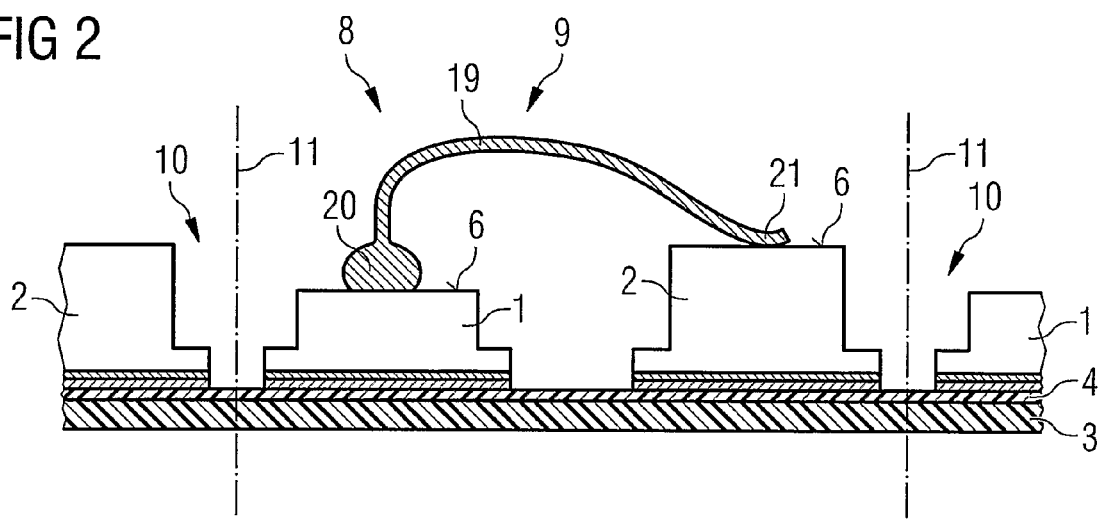
FIG. 2 illustrates the wire bonding process of the components of FIG. 1.

FIG. 2 illustrates the next process in the method according to the invention. While the plurality of receiver dies 1 and the plurality of emitter dies 2 are attached to the adhesive tape 3, the wire bonding process is carried out. A wire bond 19 is formed between each receiver die 1 and emitter die 2 which are to form a component 9.

The wire bond 19 between the receiver die 1 and the emitter die 2 is formed by a ball-bonding technique. The ball bond, characterised by the ovoid head 20, is first bonded to the upper surface 6 of the receiver die 1. The wire 19 is then extended to the upper surface 6 of the emitter die 2 where it is attached by a wedge bond 21. A wire bond 19 is formed between each of the pairs of receiver die 1 and emitter die 2 which make up a component 9 in the same process step. At this stage of the process, a plurality of wire-bonded components 9 are arranged in a regular grid array on an adhesive tape 3.

FIG. 3 illustrates the next stage in the method of the invention and shows a cross-sectional view of a section of a panel 22. According to the method of the invention, in the next process of the method the plurality of components 9 are encapsulated in a single molding compound 23 while still attached to the adhesive tape 3. The mold material 23 is then cured to form a single panel 22 in which all of the components 9 are embedded. The lower surface 24 of the metallization layer 17 of the receiver dies 1 and emitter dies 2 remains free of the mold or encapsulation material 23 since it is in contact with the adhesive surface 4 of the adhesive tape 3. The lower surface 24 of the plurality of components are coplanar with the lower surface of the mold material and form the lower surface 25 of the panel 22.

In the next stage of the process, the upper surface 26 of each package 8 is laser marked. The adhesive tape 3 is then removed from the lower surface 25 of the panel 22 and a second adhesive tape or package lamination tape 28 is fixed to the upper surface 26 of the panel 22. The detaping and retaping processes may be performed in the reverse order.

In the next stage of the method depicted in FIG. 4, the plurality of individual packages 8 are singulated from the panel 22. This is carried out by sawing the panel 22 in approximately the lateral centre 11 of the package singulation trenches 10 which separate adjacent components 9 in the panel 22. The plurality of packages 8 are still attached to the package lamination tape 28 after the package singulation process. The individual packages 8 can then undergo electrical testing as indicated by the probes 29 as the external contact areas provided by the metallization layers 16 on the receiver dies 1 and emitter dies 2 are exposed from the mold material 23.

The package lamination tape 28 is then removed from the plurality of packages 8. This can be easily performed by irradiating the tape 28 with UV radiation which enables the tape 28 to be cleanly removed from the mold compound 23 of the package 8.

The packages 8 are then packed into a carrier or transport tape and shipped to the customer or point of use. The packages 8 are then mounted onto an external substrate such as a printed circuit board typically by a soldering technique.

Figure 5:
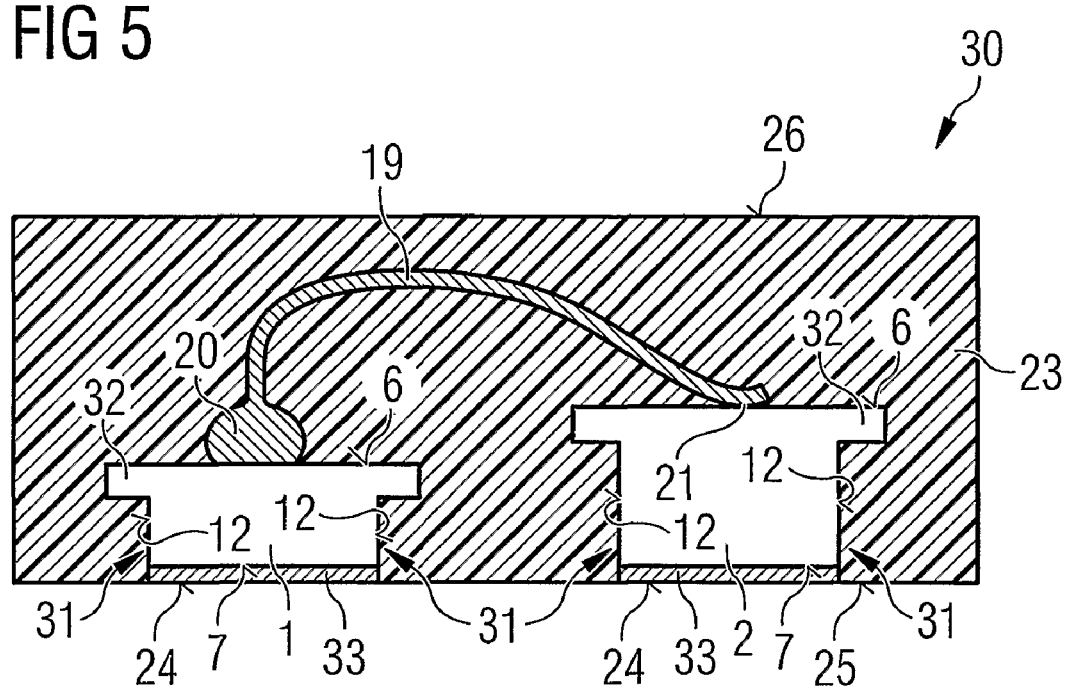
FIG. 5 illustrates a second embodiment of the package fabricated using the method of the invention.

FIG. 5 illustrates a second embodiment of a package 30 fabricated using the method of the invention. Parts of the package 30, according to the second embodiment of the invention, which are essentially the same as those of the package 8 of the first embodiment of the invention are denoted by the same reference number and are not necessarily described again.

The second package 30 differs from the first package 8 in that the side faces 12 of the receiver die 1 and the side faces of the emitter die 2 include a cutout 31 in the edge formed between the lower surface 7 and the side faces 12. Therefore, the upper surface 6 of the dies 1, 2 is laterally larger than that of the lower surface 7. The side faces 12 have a stepped contour and the receiver die 1 and emitter die 2 have an upper portion 32 which protrudes laterally outwards. In this embodiment of the invention, the metallization layer 33 consists of a single metal layer.

According to the invention, the use of a substrate in the package or for the assembly of the package is avoided. The size of the package 8, 30 produced by the method of the invention is, therefore, reduced over the size of the prior art packages. The lateral size of the packages 8, 30 is typically 0.5 mm by 0.3 mm, which is a factor of around two smaller than prior art packages including a substrate. Since the packages 8, 30 of the invention are leadless and substrate-less, the height of the packages 8, 30 can be reduced to about 0.2 mm or even to 0.1 mm which is a factor of up to four smaller than the prior art packages.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of producing a semiconductor device, comprising:
    attaching a lower surface of a first semiconductor die to a first adhesive tape;
    attaching a lower surface of a second semiconductor die to the first adhesive tape adjacent to the first semiconductor die;
    forming a wire bond between an upper surface of the first semiconductor die and an upper surface of the second semiconductor die;
    encapsulating the first and second semiconductor dies in encapsulation material to form a panel, the panel having a first surface and a second surface, wherein the second surface of the panel is attached to the first adhesive tape;
    depositing a metallization layer on the lower surface of the first die; and
    depositing a metallization layer on the lower surface of the second die;
    wherein depositing the metallization layers includes:
        depositing a first metallization layer by a vacuum deposition process; and
        depositing a second metallization layer by an electroplating process.

2. A method of producing a semiconductor device, comprising:
    attaching a lower surface of a first semiconductor die to a first adhesive tape;
    attaching a lower surface of a second semiconductor die to the first adhesive tape adjacent to the first semiconductor die;
    forming a wire bond between an upper surface of the first semiconductor die and an upper surface of the second semiconductor die;
    encapsulating the first and second semiconductor dies in encapsulation material to form a panel, the panel having a first surface and a second surface, wherein the second surface of the panel is attached to the first adhesive tape;
    depositing a metallization layer on the lower surface of the first die; and
    depositing a metallization layer on the lower surface of the second die;
    wherein depositing the metallization layer includes:
        depositing a first metallization layer by a vacuum deposition process; and
        depositing a second metallization layer by a galvanic deposition process.

3. A method of producing a semiconductor device, comprising:
    attaching a lower surface of a first semiconductor die to a first adhesive tape;
    attaching a lower surface of a second semiconductor die to the first adhesive tape adjacent to the first semiconductor die;
    forming a wire bond between an upper surface of the first semiconductor die and an upper surface of the second semiconductor die;
    encapsulating the first and second semiconductor dies in encapsulation material to form a panel, the panel having a first surface and a second surface, wherein the second surface of the panel is attached to the first adhesive tape;
    attaching the lower surfaces of a plurality of the first semiconductor dies to the first adhesive tape;
    attaching the lower surfaces of a plurality of the second semiconductor dies to the first adhesive tape; and
    forming wire bonds between the upper surfaces of pairs of the first and second semiconductor dies, wherein respective pairs of the wire bonded first and second semiconductor dies form components.

4. The method of claim 3, further comprising depositing a metallization layer on the lower surface of the first die and depositing a metallization layer on the lower surface of the second die.

5. The method of claim 4, wherein depositing the metallization layer includes:
    depositing a first metallization layer by a vacuum deposition process; and
    depositing a second metallization layer by an electroplating process.

6. The method of claim 3, further comprising:
    removing the first adhesive tape from the second surface of the panel; and
    attaching a second adhesive tape to the first surface of the panel.

7. The method of claim 6, further comprising:
    singulating the components from the panel to form packages attached to the second adhesive tape; and
    removing the packages from the second adhesive tape and packing the packages into packing tape.

8. The method of claim 7, wherein the second adhesive tape is removed by irradiating the tape by UV irradiation.

9. A semiconductor device, comprising:
    a first semiconductor die having an upper surface and a lower surface;
    a second semiconductor die having an upper surface and a lower surface; and
    a wire bond connecting the upper surfaces of the first and second semiconductor dies;
    encapsulation material embedding the first and second semiconductor dies, wherein the lower surfaces of the first semiconductor die and the second semiconductor die are essentially coplanar with a lower surface of the encapsulation material;
    a plurality of the first semiconductor dies;
    a plurality of the second semiconductor dies, each of the second semiconductor dies being wire bonded to a corresponding one of the first semiconductor dies to form components;
    wherein the first semiconductor die and the second semiconductor die of each component are separated by a distance; and
    wherein the lower surfaces of the first semiconductor dies and the second semiconductor dies are essentially coplanar with a lower surface of the encapsulation material.

10. The semiconductor device of claim 9, wherein the lower surface of the semiconductor dies and the lower surface of the encapsulation material is attached to a first adhesive tape.

11. The semiconductor device of claim 9, wherein the first semiconductor dies and the second semiconductor dies have at least one side face with a stepped contour.

12. The semiconductor device of claim 11, wherein the first semiconductor die and the second semiconductor die have a protruding upper portion.

13. The semiconductor device of claim 11, wherein the first semiconductor die and the second semiconductor die have a protruding base portion.

14. The semiconductor device of claim 9, wherein the lower surface of the first semiconductor die and the lower surface of the second semiconductor die includes a metallization layer, the metallization layer and the lower surface of the encapsulation material being essentially coplanar.

15. The semiconductor device of claim 14, wherein the metallization layer comprises first and second layers, wherein the first layer comprises Ni or a Ni alloy and the second layer comprises silver or a silver alloy or gold or a gold alloy.

16. The semiconductor device of claim 9, wherein the plurality of first semiconductor dies are receiver dies and the plurality of second semiconductor dies are emitter or conductive dies.

17. The semiconductor device of claim 9, wherein the device has dimensions of approximately 0.5 mm in width, approximately 0.3 mm in breadth and approximately 0.2 mm in height.

* * * * *